United States Patent
Figov et al.

(10) Patent No.: US 8,637,223 B2
(45) Date of Patent: *Jan. 28, 2014

(54) PREPARATION OF LITHOGRAPHIC PRINTING PLATES

(75) Inventors: Murray Figov, Ra'anana (IL); Moshe Marom, Herzlia (IL); Ilan Levi, Natanya (IL)

(73) Assignee: Eastman Kodak Company, Rochester, NY (US)

( * ) Notice: Subject to any disclaimer, the term of this patent is extended or adjusted under 35 U.S.C. 154(b) by 182 days.

This patent is subject to a terminal disclaimer.

(21) Appl. No.: 13/036,283

(22) Filed: Feb. 28, 2011

(65) Prior Publication Data

US 2012/0219915 A1 Aug. 30, 2012

(51) Int. Cl.
*B41M 5/00* (2006.01)
*B41N 1/00* (2006.01)
*G03F 7/00* (2006.01)
*G03F 7/26* (2006.01)

(52) U.S. Cl.
USPC ........ 430/302; 430/270.1; 430/309; 430/351; 430/434; 101/453; 101/463.1

(58) Field of Classification Search
USPC .......................................... 430/302
See application file for complete search history.

(56) References Cited

U.S. PATENT DOCUMENTS

| 5,521,054 | A * | 5/1996 | Takagi et al. ............... 430/331 |
| 7,402,374 | B2 | 7/2008 | Oohashi et al. |
| 2009/0047599 | A1 | 2/2009 | Horne et al. |
| 2010/0316956 | A1 * | 12/2010 | Memetea et al. ............ 430/302 |

FOREIGN PATENT DOCUMENTS

| GB | 1 215 437 | 12/1970 |
| JP | 2008-230122 | 2/2008 |
| WO | WO 2008113582 A1 * | 9/2008 |

* cited by examiner

*Primary Examiner* — Cynthia H Kelly
*Assistant Examiner* — Chanceity Robinson
(74) *Attorney, Agent, or Firm* — J. Lanny Tucker

(57) ABSTRACT

Negative-Working Lithographic Printing Plate Precursors can be provided with desired contrast coloration after imaging using a coloring fluid that includes a water-insoluble colorant that is soluble in a water-insoluble fatty alcohol. The coloring fluid provides an optical density change in the exposed regions of at least $OD_2$ that is greater than the original optical density of those regions, $OD_1$. The coloring fluid can be applied immediately after imaging and before processing, or it can be applied as part of the developer or processing solution, or it can be applied after processing. The coloring fluid can also be applied to imaged precursors that are designed for either off-press or on-press development.

25 Claims, No Drawings

PREPARATION OF LITHOGRAPHIC PRINTING PLATES

FIELD OF THE INVENTION

This invention relates to a method of preparing lithographic printing plates from negative-working lithographic printing plate precursors. This method uses a unique coloring fluid to provide image coloration.

BACKGROUND OF THE INVENTION

In conventional "wet" lithographic printing, ink receptive regions, known as image areas, are generated on a hydrophilic surface. When the surface is moistened with water and a lithographic ink is applied, the hydrophilic regions retain the water and repel the ink, and the ink receptive regions accept the ink and repel the water. The lithographic ink is eventually transferred to the surface of a material upon which the image is to be reproduced.

Lithographic printing plate precursor useful to prepare lithographic printing plates typically comprise one or more imageable layers applied over the hydrophilic surface of a substrate. The imageable layers include one or more radiation-sensitive components that can be dispersed in a suitable binder. Alternatively, the radiation-sensitive component can also be the binder material. Following imaging, either the imaged (exposed) regions or the non-imaged (non-exposed) regions of the imageable layer are removed by a suitable developer, revealing the underlying hydrophilic surface of the substrate. If the imaged regions are removed, the precursor is considered as positive-working. Conversely, if the non-imaged regions are removed, the precursor is considered as negative-working. In each instance, the regions of the imageable layer (that is, the image areas) that remain are ink-receptive, and the regions of the hydrophilic surface revealed by the developing process accept water and aqueous solutions, typically a fountain solution, and repel lithographic printing ink.

Direct digital imaging has become increasingly important in the printing industry. Imageable elements for the preparation of lithographic printing plates have been developed for use with infrared lasers that image in a platesetter in response to signals from a digital copy of the image in a computer. This "computer-to-plate" technology has generally replaced the former technology where masking films were used to image the elements.

In general, lithographic printing plate precursors contain a colorant (dye or pigment) in the radiation-sensitive composition that has the function of making the resulting image visible in order to be evaluated by optical density measurements before being mounted on a printing press. In other words, such colorants provide contrast between the image and the background. Certain lithographic printing plate precursors cannot contain a colorant for different reasons. For example, the imaged precursors that are usually developed on-press have a colorless coating because if a colorant is present, it could contaminate the lithographic printing ink and the fountain solution used for development and printing, with the result of altering the printed color shades. However, sometimes it is necessary for such lithographic printing plates to be used the same way as those developed off-press. In such instances, the image needs to be seen and evaluated.

Other lithographic printing plate precursors contain materials that are not compatible with contrast-providing colorants. The resulting lithographic printing plates have a faint colored image that is difficult to distinguish from the anodized aluminum substrate background. This low image contrast makes it almost impossible to evaluate these printing plates for image quality, such as image resolution as measured using optical density measurements before mounting the printing plates onto a press. Such "colorless" printing plates are also difficult to "register" (align) when mounting them onto a printing press. Image registration (alignment) is very important in color printing in order to ensure image sharpness (resolution) and correct tinting shades.

In addition, it is a well known phenomenon that offset lithographic printing plates containing sufficient coloration to be visible and measureable, when subject to a development stage, leave significant contaminants of the dye used to color the plates within the developer unit. Such coloration has been tolerated as an inevitable part of the process. Since any resinous material left within the developer unit has to be removed, dye residues color the developer and cannot be easily completely removed. Thus, there is a need to avoid this problem that occurs in development.

U.S. Pat. No. 6,451,491 (Dhillon et al.) describes high loading of contrast-providing pigments into the imaging layer using specific poly(vinyl acetal) polymers and specific combinations of loading solvent mixtures. Such high amounts of pigments can destabilize the imaging chemistry or the developers used to remove non-imaged regions in negative-working lithographic printing plate precursors.

Other contrast-providing colorants are obtained from leuco dyes that become colored in the presence of an acid or thermal acid generator, as described, for example in U.S. Pat. Nos. 7,402,374 (Oohashi et al.), 7,425,406 (Oshima et al.) and 7,462,440 (Yamasaki). These imaging materials have a number of disadvantages that provide reasons for not using them. In part, these leuco dyes adversely affect the shelf-life, the mechanical properties, and the run-length of the photosensitive coating.

U.S. Patent Publication 2010-0316956 (Memetea et al.) describes a method of preparing a lithographic printing plate by exposing a negative-working lithographic printing plate precursor having an optical density of $OD_1$ and applying a coloring fluid to the exposed precursor such that the optical density in the exposed regions is $OD_2$ that is greater than $OD_1$. This coloring fluid comprises a water-insoluble colorant and a water-miscible solvent that is capable of swelling the exposed imageable layer. While this method provides a way to provide coloration in lithographic printing plates, there is a need to improve upon the method by further reducing residual dye contamination of the background, and further improving printing plate run length.

An alternative approach is to add a dye such as Crystal Violet to the processing liquid. While this approach provides the desired coloration, it can cause contamination in the processing bath.

U.S. Patent Publication 2009-0047599 (Home et al.) describes the use of spirolactams or spirolactones in the processing liquid. Such compounds are colorless in the liquid but become colored when the pH is decreased. While this also provides desired coloration, it can be difficult to regulate the pH so that the color change occurs only after processing and not in the processing liquid itself and that the changes do not affect the processing process and subsequent plate performance.

There is a need for an improved means for providing contrast between the image and background of lithographic printing plates, especially those prepared from negative-working lithographic printing plate precursors. It is also desirable that some embodiments of precursors are designed for on-press development.

SUMMARY OF THE INVENTION

This invention provides a method of preparing a lithographic printing plate comprising, in order:

imagewise exposing a negative-working lithographic printing plate precursor comprising a substrate and a radiation-sensitive imageable layer disposed thereon comprising a free radically polymerizable compound, a radiation absorber, a free radical initiator composition, and a polymeric binder, to provide an exposed precursor comprising exposed and non-exposed regions in the imageable layer, wherein the exposed regions have an optical density of $OD_1$, and applying a coloring fluid to the exposed precursor such that the optical density in the exposed regions is $OD_2$ that is greater than $OD_1$, wherein the coloring fluid comprises a water-insoluble fatty alcohol and a water-insoluble colorant that is soluble in the water-insoluble fatty alcohol.

In some embodiments, the method of this invention further comprises:

removing the non-exposed regions in the imageable layer using a processing solution, to provide a lithographic printing plate, and subsequently applying the coloring fluid to the lithographic printing plate.

This invention also provides a lithographic printing plate coloring fluid comprising a water-insoluble colorant dissolved in a water-insoluble fatty alcohol having at least 4 carbon atoms.

The advantages of this invention include a reduction in the amount of residual dye contamination of the background in an imaged lithographic printing plate. Moreover, the imaged regions in the printing plate are not swollen or damaged by the coloring fluid used to provide the contrast image. These advantages are provided by using the coloring fluid of this invention in any of various stages or steps of the method. For example, it can be applied as the developer or processing solution to remove the non-exposed regions of the imageable layer. Alternatively, it can be applied before development or processing with a different processing solution. Still again, it can be applied after development or processing with a different processing solution.

As described below, the beneficial effects of the coloring can be achieved by heating or exposure of the precursor to UV radiation during or after application of the coloring fluid. Alternatively, heating and UV exposure can be carried out simultaneously.

DETAILED DESCRIPTION OF THE INVENTION

Definitions

Unless the context indicates otherwise, when used herein, the terms "lithographic printing plate precursor", "negative-working lithographic printing plate precursor", and "printing plate precursor" are meant to be references to embodiments useful in the present invention.

In addition, unless the context indicates otherwise, the various components described herein such as "polymeric binder", "initiator", "co-initiator", "free radically polymerizable component", "radiation absorber", "water-insoluble colorant", "water-insoluble fatty alcohol", "surfactant", "hydrophilic polymer", "water-miscible organic solvent", and similar terms also refer to mixtures of such components. Thus, the use of the articles "a", "an", and "the" is not necessarily meant to refer to only a single component.

The terms "coloring fluid" and "lithographic printing plate coloring fluid" are meant to refer to the solutions of this invention.

Moreover, unless otherwise indicated, percentages refer to percents by dry weight, for example, weight % based on total solids in solutions or dispersions, or dry layer weight.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

"Graft" polymer or copolymer refers to a polymer having a side chain that has a molecular weight of at least 200.

The term "polymer" refers to high and low molecular weight polymers including oligomers and includes homopolymers and copolymers.

The term "copolymer" refers to polymers that have two or more different recurring units, in random order along the backbone, unless otherwise indicated.

The term "backbone" refers to the chain of atoms (carbon or heteroatoms) in a polymer to which a plurality of pendant groups are attached. One example of such a backbone is an "all carbon" backbone obtained from the polymerization of one or more ethylenically unsaturated polymerizable monomers. However, other backbones can include heteroatoms wherein the polymer is formed by a condensation reaction or some other means.

The term "water-insoluble colorant" refers to a water-insoluble dye or pigment, as well as mixtures of such dyes, pigments, or dyes and pigments.

The term $OD_1$ refers to the optical density of a solid image of the lithographic printing plate precursor as measured using a spectrodensitometer. This value is an average of densitometer readings taken over several solid patches distributed across the printing plate precursor. Each of the solid patches should be large enough for proper densitometer readings according to the operating instructions for the particular instrument being used. Optical density (OD) can be determined using a suitable spectrodensitometer such as an X-Rite 500 (X-Rite, Inc., Grand Rapids, Mich.). This spectrodensitometer is fitted with four filters used to measure the density of four process colors: cyan, magenta, yellow, and black. Typically, one skilled in the art would be able to identify which filter to choose when measuring optical density. For example, one could measure the solid image area with each of the four filters independently and then select the filter that results in the maximum optical density value.

The term $OD_2$ refers to the optical density of the solid exposed and colored regions of the imaged lithographic printing plate precursor ("imaged precursor"). This value is an average taken over colored solid image regions. The spectrodensitometer filter is chosen as described above for the $OD_2$ measurement.

The difference between $OD_1$ and $OD_2$ in the practice of this invention is generally at least 0.1 and generally at least 0.25.

Coloring Fluid

As described in more detail below, the coloring fluid can be applied to the imaged lithographic printing plate precursor before, during, or after processing (development) to remove non-exposed regions in the imageable layer. If the coloring fluid is applied prior to processing, the non-exposed regions of the imageable layer can be at least partially retained until processing.

The coloring fluid generally includes water-insoluble colorants such as pigments or water-insoluble dyes that are dissolved in one or more water-insoluble fatty alcohols. The coloring fluid can optionally include one or more emulsifier (described below) particularly if the coloring fluid is an oil-in-water emulsion in which the aqueous phase is compatible with a processing solution and the oil phase comprises the one or more water-insoluble fatty alcohols. De-sensitizers that maintain the water-carrying property of anodized aluminum can also be added. If the coloring fluid also acts as a "developer" to remove non-exposed regions in the imageable layer, other components can be present as described below.

The coloring fluid of this invention generally has a pH of at least 5 and up to and including 14, or typically at least 6 and up to and including 13, or more likely, at least 6 and up to and including 11. The pH can be chosen so that the coloring fluids have their optimal usefulness, and the pH can also be adjusted if the coloring fluid also serves as a developer (processing solution) as described below. The coloring fluid pH can be adjusted or buffered using the appropriate acids or bases or buffers as one skilled in the art would readily understand.

Water-insoluble colorants from all classes can be used including water-insoluble dyes. Useful water-insoluble dye classes include but are not limited to, oleophilic diazo, phenazine, triphenazine-oxazine, and induline dyes and specific examples include Sudan Black B and nigrosine dyes (Solvent Black 5, Solvent Black 7, Acid Black 2, and carboxyl modified nigrosine). Mixtures of two or more of such oleophilic dyes can also be used. Useful pigments include but are not limited to azo pigments, azo lake pigments, condensed azo pigments, chelated azo pigments, phthalocyanine pigments, anthraquinone pigments, perylene and perynone pigments, thioindigo pigments, quinacridone pigments, dioxazine pigments, isoindolinone pigments, quinophthalone pigments, dying lake pigments, azine pigments, nitroso pigments, nitro pigments, natural pigments, fluorescent pigments, inorganic pigments, graphite, and carbon blacks.

The coloring fluid includes one or more water-insoluble colorants in an amount of at least 0.1 and up to and including 3 weight %, typically at least 0.3 and up to and including 2.5 weight %, and more typically at least 0.5 and up to and including 2 weight %. Useful water-insoluble dyes and pigments generally have a particle size of at least 0.001 and up to and including 10 µm, or typically at least 0.001 and up to and including 1 µm, or more typically at least 0.001 and up to and including 0.05 µm.

The water-insoluble colorants are dissolved within one or more water-insoluble fatty alcohols. Such fatty alcohols generally comprise at least 4 carbons and can be in liquid or solid form at room temperature. Examples of useful fatty alcohols include but are not limited to, isoamyl alcohol, tridecanol, cis-9-octadecen-1-ol, oleyl alcohol, 3-allyl 1,2, propane diol, octadecanol, and hexyl decanol. Tridecanol is particularly useful because it can be obtained as a liquid with minimal odor. The one or more water-insoluble fatty alcohols can be present in the coloring fluid in an amount of at least 10 weight % and up to and including 80 weight % or typically at least 25 weight % and up to and including 65 weight %.

In some embodiments, the coloring fluid comprises one or more photoinitiators, each of which is capable of providing free radicals upon exposure to UV radiation. This provides a way for continuing any possible crosslinking in the image regions for further hardening. Such photoinitiators are soluble or dispersible in the coloring fluid. The UV photoinitiators generally have sensitivity at a $\lambda_{max}$ of from about 300 to about 450 nm. Classes of useful compounds include but are not limited to, benzophenones, ketones, acetophenones, acylphosphine oxides, alkylaryl ketones, benzoin derivatives, methylobenzoin and 4-benzoyl-1,3-dioxolane derivatives, benzilketals, α,α-dialkoxyacetophenones, α-hydroxy alkyl phenones, and α-aminoalkylphenones. The UV photoinitiators generally are not water-soluble and are dissolved in the water-insoluble fatty alcohol or other organic compounds in the coloring fluid as described below before being added to the rest of the coloring fluid.

Representative UV photoinitiators are 2-benzyl-2-dimethylamino-1-(4-morpholinophenyl)-butan-1-one, α,α-dimethoxy-α-hydroxy acetophenone, 1-(4-isopropylphenyl)-2-hydroxy-2-methyl-propan-1-one, 1-[4-(2-hydroxyethyloxy)phenyl]-2-hydroxy-2-methyl-propan-1-one, benzophenone, 1-hydroxy-cyclohexyl-phenyl ketone, 2,4,6-trimethylbenzoyldiphenyl-phosphine oxide, 4-methyl benzophenone, and benzil. Mixtures of these can be used if desired.

The UV photoinitiator is generally present in the coloring fluid in an amount of at least 0.001 weight % and up to and including 1 weight % or at least 0.002 and up to and including 0.1 weight %.

In order to obtain optimum cleanliness of image background, a water-miscible, non-volatile material such as a water-miscible polar organic solvent, can be added. A representative material of this type is 2-phenoxy ethanol. Although the water-insoluble colorant may not be soluble in this material, the material can be mixed with the fatty alcohol and in the case of the solid alcohols, provide a liquid for the coloring fluid. In such embodiments, the water-insoluble colorant is first dissolved in the fatty alcohol which if solid is warmed to melt it, and then the water-miscible material is added.

It is believed that the water-insoluble fatty alcohol and water-insoluble colorant are preferentially absorbed onto the oleophilic image regions of the imageable layer while the water-miscible material is absorbed onto the hydrophilic aluminum-containing substrate (if the imaged precursor has been processed) or washes away the non-polymerized background regions because of its affinity for the hydrophilic aluminum-containing substrate.

It was found that the coloring effect can be further enhanced by using a coloring fluid that is an oil-in-water emulsion where the aqueous external phase is based on a developer (processing) liquid and the internal phase is the coloring fluid. In offset lithographic printing the fountain solution is attracted to the hydrophilic background areas of the printing plate and the ink is repelled from the aqueous film formed in those areas and then is attracted to the oleophilic image areas. In the present invention, the aqueous part of the coloring fluid emulsion can clean the hydrophilic background and at the same time form the hydrophilic film. The water-insoluble part of the coloring fluid emulsion is then attracted to the imaged (exposed) regions where the oleophilic dye becomes absorbed. Thus, if the coloring fluid is an emulsion, it can also contain a suitable emulsifier and be formulated to give an emulsion of long life stability.

When the coloring fluid is also used to process or develop the imaged precursor, it can further include at least 5 weight % of one or more water-miscible polar organic solvents that are commonly used in some lithographic developers, including but not limited to, butoxyethanol, γ-butyrolactone, diethanol amine, triethanolamine, benzyl alcohol, phenoxyethanol, ethylene glycol monomethyl ether, propylene glycol monomethyl ether, propylene glycol methyl ether acetate, dipropylene (or ethylene) glycol monomethyl ether, cyclohexanone, cyclohexanol, toluene, kerosene, mineral spirits, dichloroethane, and tetrachloroethane. Benzyl alcohol, phenoxy ethanol, γ-butyrolactone, butoxyethanol, diacetone alcohol, cyclohexanone, cyclohexanol, glycol ether, a petroleum fraction, a glycol ester, an alkyl lactate, toluene, or a combination of any of these, are particularly useful. One or more of these water-miscible polar organic solvents can be present in the coloring fluid in an amount of at least 5 weight % and up to and including 15 weight %.

Emollients can be present in the coloring fluid including but are not limited to, ethylene glycol, diethylene glycol, di- and tri-ethanol amine, fatty acids and salts and esters thereof, propanol, isopropanol, and cyclohexanol, in an amount of at least 0.5 weight %.

The coloring fluid can also including one or more surfactants including nonionic surfactants, anionic surfactants, cationic surfactants, amphoteric surfactants, and fluorine-containing surfactants, or multiple types of surfactants. Useful nonionic surfactants include one or more compounds from the following classes of compounds: polyoxyethylene alkyl ethers, polyoxyethylene alkylphenylethers, polyoxyethylene polystyrylphenyl ethers, polyoxyethylene polyoxypropylene alkyl ethers, polyoxyethylene sorbitol fatty acid partial esters, polyethylene glycol fatty acid esters, fatty acid diethanolamides, polyoxyethylene alkylamines, triethanolamine fatty acid esters, trialkylamine oxides, and copolymers of polyethylene glycol and polypropylene glycol. Other useful nonionic surfactants include the β-naphthol ethoxylates such as those commercially available as Lugalvan® BNO 12 and 24 from BASF.

Useful anionic surfactants include but are not limited to, fatty acid salts, abietic acid salts, hydroxyalkanesulfonic acid salts, dialkylsulfosuccinic ester salts, alkylbenzenesulfonic acid salts, alkylnaphthalenesulfonic acid salts, alkylphenoxy polyoxyethylene propylsulfonic acid salts, polyoxyethylene alkylsulfophenyl ether salts, N-alkylsulfosuccinic acid monoamide disodium salts, alkyl or aryl sulfonic acid salts, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styrylphenyl ether sulfate ester salts, alkyl phosphate ester salts, polyoxyethylene alkyl ether phosphate ester salts, and polyoxyethylene alkyl phenyl ether phosphate ester salts.

Useful cationic surfactants include but are not limited to alkylamine salts, quaternary ammonium salts, polyoxyethylene alkyl amine salts, and polyethylene polyamine derivatives.

Useful amphoteric surfactants include but are not limited to, carboxybetaines, aminocarboxylic acids, sulfobetaines, aminosulfuric esters, and imidazoline-based surfactants.

Useful fluorine-containing surfactants include but are not limited to, an anionic type, for example, fluoroalkyl carboxylates, fluoroalkyl sulfonates and fluoroalkylphosphates; an amphoteric type, for example, fluoroalkyl betaines; a cationic type, for example, fluoroalkyl trimethyl ammonium salts, and a nonionic type, for example, fluoroalkyl amine oxides, fluoroalkyl ethylene oxide adducts with any number of substituting F atoms in the alkyl group from 1 to total substitution (perfluoro compounds).

One or more surfactants can be present in the coloring fluid in an amount of at least 0.001 weight % and up to and including 20 weight %, or typically at least 0.2 weight % and up to and including 5 weight %.

Examples of pigment dispersants that can be present include but are not limited to, wetting agents or dispersant agents such as polymeric dispersants with or without electrical charge that work by steric hindrance or by electrostatic repulsion mechanism, amine and carboxyl containing polymers, siliconic, and organo/siliconic dispersants with pigment affinic groups.

Aluminum de-sensitizers can also be present in the coloring fluid. These compounds include but are not limited to, gums (for example, gum arabic and carragean gum), dextrines, cellulose derivatives (such as carboxymethyl cellulose) and phosphoric acid. Alcohols and glycols can be present as wetting agents without being limited to these compounds. Post baking "gums" that protect the image from thermal decomposition and the anodized aluminum background from re-deposition, such as Dowfax® 2A-0 and Dowfax® 2A-1 can be present also.

Thus, in many embodiments, the coloring fluid comprises one or more of a glycol, gum, dextrine, cellulose ester, phosphoric acid or ester, phosphonic acid or ester, citric acid, or citrate in amounts that would be readily determined from routine experimentation.

When the coloring fluid is also used as a processing solution (developer) to remove non-exposed regions of the imageable layer, the water-insoluble colorant and water-insoluble fatty alcohol can be added to known developers or processing solutions, particularly if the water-insoluble colorant and water-insoluble fatty alcohol are added as an emulsion that is dispersed within the processing solution. Such coloring fluids can then include surfactants, chelating agents (such as salts of ethylenediaminetetraacetic acid), organic solvents (such as benzyl alcohol), film-forming water-soluble or hydrophilic polymers, and alkaline components (such as inorganic metasilicates, organic metasilicates, hydroxides, and bicarbonates).

Some useful alkaline aqueous developers that can be modified to be used as coloring fluids include but are not limited to, 3000 Developer, 9000 Developer, GOLDSTAR Developer, GREENSTAR Developer, ThermalPro Developer, PROTHERM Developer, MX1813 Developer, and MX1710 Developer (all available from Eastman Kodak Company).

Some useful solvent-containing developers that can be modified to be used as coloring fluids include but are not limited to, ND-1 Developer, Developer 980, Developer 1080, 2 in 1 Developer, 955 Developer, D29 Developer (described below), and 956 Developer (all available from Eastman Kodak Company). These developers can be diluted with water if desired.

In some instances, the coloring fluid (or processing solution) can be used to both develop the imaged precursor by removing predominantly the non-exposed regions and also to provide a protective layer or coating over the entire imaged and developed surface. In this aspect, the coloring fluid (or processing solution) behaves somewhat like a gum that is capable of protecting (or "gumming") the lithographic image on the printing plate against contamination or damage (for example, from oxidation, fingerprints, dust, or scratches). Such coloring fluids can include a film-forming hydrophilic polymer and an anionic or nonionic surfactant, examples of which are described above.

Useful film-forming water-soluble or hydrophilic polymers can be present in the coloring fluid in an amount of at least 0.25 weight % and up to 30 weight % and typically at least 1 and up to and including 15 weight %. Examples of useful polymers of this type include but are not limited to, gum arabic, pullulan, cellulose derivatives (such as hydroxymethyl celluloses, carboxymethylcelluloses, carboxyethylcelluloses, and methyl celluloses), starch derivatives [such as (cyclo)dextrins, starch esters, dextrins, carboxymethyl starch, and acetylated starch] poly(vinyl alcohol), poly(vinyl pyrrolidone), polyhydroxy compounds [such as polysaccharides, sugar alcohols such as sorbitol, miso-inosit, homo- and copolymers of (meth)acrylic acid or (meth)acrylamide], copolymers of vinyl methyl ether and maleic anhydride, copolymers of vinyl acetate and maleic anhydride, copolymers of styrene and maleic anhydride, and copolymers having recurring units with carboxy, sulk), or phospho groups, or salts thereof. Useful hydrophilic polymers include gum arabic, (cyclo)dextrin, a polysaccharide, a sugar alcohol, or a homo- or copolymer having recurring units derived from (meth)acrylic acid.

Imaging

During use, the lithographic printing plate precursor is exposed to a suitable source of exposing radiation depending upon the radiation absorber present in the imageable layer, at a wavelength of from about 250 to about 450 nm or from about 700 to about 1500 nm. For example, when the lithographic printing plate precursor contains an infrared radiation absorber to render it infrared radiation-sensitive, imaging can be carried out using imaging or exposing radiation, such as from an infrared laser (or an array of lasers) at a wavelength of at least 700 nm and up to and including about 1400 nm and typically at least 700 nm and up to and including 1200 nm. Imaging can be carried out using imaging radiation at multiple wavelengths at the same time if desired. Thus, this imaging provides both exposed (and hardened) regions and non-exposed regions in the imageable layer disposed on the hydrophilic substrate. The laser used to expose the lithographic printing plate precursor is usually a diode laser (or array of diode lasers), because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of at least 800 nm and up to and including 850 nm or at least 1060 and up to and including 1120 nm.

The imaging apparatus can function solely as a platesetter or it can be incorporated directly into a lithographic printing press. In the latter case, printing may commence immediately after imaging and development, thereby reducing press set-up time considerably. The imaging apparatus can be configured as a flatbed recorder or as a drum recorder, with the imageable member mounted to the interior or exterior cylindrical surface of the drum. An example of an useful imaging apparatus is available as models of Kodak Trendsetter platesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging with infrared radiation can be carried out generally at imaging energies of at least 150 mJ/cm$^2$ and up to and including 500 mJ/cm$^2$, and typically at least 200 mJ/cm$^2$ and up to and including 400 mJ/cm$^2$ depending upon the sensitivity of the imageable layer.

Useful UV and "violet" imaging apparatus include Prosetter (from Heidelberger Druckmaschinen, Germany), Luxel V-8 (from FUJI, Japan), Python (Highwater, UK), MakoNews, Mako 2, Mako 4 or Mako 8 (from ECRM, US), Micra (from Screen, Japan), Polaris and Advantage (from AGFA, Belgium), Laserjet (from Krause, Germany), and Andromeda® A750M (from Lithotech, Germany), imagesetters.

Imaging radiation in the UV to visible region of the spectrum, and particularly the UV region (for example at least 250 nm and up to and including 450 nm), can be carried out generally using energies of at least 0.01 ml/cm$^2$ and up to and including 0.5 mJ/cm$^2$, and typically at least 0.02 mJ/cm$^2$ and up to and including about 0.1 mJ/cm$^2$. It would be desirable, for example, to image the UV/visible radiation-sensitive lithographic printing plate precursors at a power density in the range of at least 0.5 and up to and including 50 kW/cm$^2$ and typically of at least 5 and up to and including 30 kW/cm$^2$, depending upon the source of energy (violet laser or excimer sources).

While laser imaging is desired in the practice of this invention, thermal imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH-7-1089).

After imaging, a heating step (pre-heating) might be used to accelerate the formation of a latent image. This heating step can be realized in so called "preheat units" that can be a separate machine or integrated into the processor that develops the imaged precursor. There are different types of preheat units. The most common ones use infrared radiation or hot air circulation, or combination thereof, to heat the imaged precursor. The temperature used for the purpose is at least 70° C. and up to and including 200° C. However, it can be advantageous to omit the preheating step to simplify the process for making lithographic printing plates.

A pre-rinse step might be carried out in a stand-alone apparatus or by manually rinsing the imaged precursor with water or the pre-rinse step can be carried out in a washing unit that is integrated in a processor used for developing the imaged precursor. The coloring fluid of this invention can be used as a "rinse" solution in this step.

Development and Printing

After thermal imaging, the imaged precursors can be processed (developed) "off-press" using a suitable processing solution as described above having a pH of at least 5 and up to and including 14, or typically at least 6 and up to and including 11. Processing is carried out for a time sufficient to remove predominantly only the non-exposed regions of the imaged imageable layer of negative-working lithographic printing plate precursors to reveal the hydrophilic surface of the substrate, but not long enough to remove significant amounts of the exposed regions. The revealed hydrophilic surface repels inks while the exposed regions containing polymerized or crosslinked polymer accept ink. Thus, the non-exposed regions to be removed are "soluble" or "removable" in the processing solution because they are removed, dissolved, or dispersed within it more readily than the regions that are to remain. The term "soluble" also means "dispersible". As noted above, the coloring fluid and processing solution can be the same, or they can be separately applied solutions.

Development can be accomplished using what is known as "manual" development, "dip" development, or processing with an automatic development apparatus (processor). In the case of "manual" development, development is conducted by rubbing the entire imaged precursor with a sponge or cotton pad sufficiently impregnated with a processing solution (described below), and optionally followed by rinsing with water. "Dip" development involves dipping the imaged precursor in a tank or tray containing the appropriate aqueous alkaline solution for at least 10 and up to and including 60 seconds under agitation, optionally followed by rinsing with water with or without rubbing with a sponge or cotton pad. The use of automatic development apparatus is well known and generally includes pumping an aqueous alkaline solution into a developing tank or ejecting it from spray nozzles. The apparatus can also include a suitable rubbing mechanism (for example a brush or roller) and a suitable number of conveyance rollers. Some developing apparatus include laser exposure means and the apparatus is divided into an imaging section and a developing section.

The method of this invention also can be carried out by processing the image lithographic printing plate precursors using a processing solution that is applied (for example sprayed) from a container (such as a developer canister) after applying the coloring fluid.

In some embodiments, the processing solution both develops and protects the outer surface of the lithographic printing plate when the processing solution includes a film-forming water-soluble or hydrophilic polymer.

As noted above, the processing solution or developer can also be the coloring fluid if the water-insoluble fatty alcohol and water-insoluble colorant are present, and thus, the coloring fluid is used to remove the non-exposed regions of the imageable layer. In such embodiments, the coloring fluid (developer) can also include a photoinitiator that provides free radicals upon exposure to UV radiation to increase crosslinking in the exposed regions of the imageable layer. Such photoinitiators are described above concerning the coloring fluid.

However, in other embodiments, the coloring fluid is applied prior to processing, particularly if the imaged precursor is developed on-press. The coloring fluid can also contain a photoinitiator that provides free radicals upon UV exposure.

In still other embodiments, the coloring fluid is applied after processing (development), with or without a photoinitiator that provides free radicals upon exposure to UV radiation. For example, if the coloring fluid is applied after processing, the resulting lithographic printing plate can be used immediately for printing. In some instances, the lithographic printing plates are used for printing after development and contact with the coloring fluid without further contact with any additional solutions such as rinsing or gumming solutions.

While applying the coloring fluid, or after it is applied, the imaged precursor can be subjected to mechanical or manual brushing or rubbing the exposed precursor, and especially if the coloring fluid is also used as a developer.

It can be desirable for the resulting lithographic printing plate to be baked in a postbake operation (heating) can be carried out, before, during, or after uniform (blanket or floodwise) exposure to UV using known conditions. In some embodiments, heating is carried out without any UV radiation exposure. Alternatively, a uniform UV radiation exposure can be carried out, without heating. In some other embodiments, the heating can be carried out either before or after, or both before and after the UV radiation exposure. The UV exposure is particularly useful when the coloring fluid or processing solution, or both, contain a UV photoinitiator as described above.

Thus, in some embodiments, the method of this invention, after applying the coloring fluid to the lithographic printing plate, the lithographic printing plate is uniformly exposed to UV radiation to further cause color change (and possibly additional crosslinking or hardening) in the exposed regions of the imageable layer while leaving the non-exposed regions unchanged.

In still other embodiments, when the coloring fluid comprises a photoinitiator that is capable of providing free radicals in response to UV radiation, the method can comprise:

after applying the coloring fluid to the lithographic printing plate, uniformly exposing the lithographic printing plate to UV radiation to further cause color change or further crosslinking (or hardening) in the exposed regions of the imageable layer while leaving the non-exposed regions unchanged.

Printing can be carried out by applying a lithographic printing ink and fountain solution to the printing surface of the imaged and developed precursor. The fountain solution is taken up by the non-imaged regions, that is, the surface of the hydrophilic substrate revealed by the imaging and processing steps, and the ink is taken up by the imaged (non-removed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the lithographic printing plate to the receiving material.

For the on-press developable precursors used in this invention, after imaging, the coloring fluid is applied, optionally followed by uniform UV radiation exposure, with or without heating, and the thus treated precursor is then put onto a printing press and after a few impressions are made using the lithographic printing ink and fountain solution, the printing image is also developed.

Negative-working Lithographic Printing Plate Precursors

The substrate used to prepare the lithographic printing plate precursors comprises a support that can be composed of any material that is conventionally used to prepare lithographic printing plates. It is usually in the form of a sheet, film, or foil (or web), and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metalized papers), or a lamination of any of these materials (such as a lamination of an aluminum foil onto a polyester film). Metal supports include sheets or foils of aluminum, copper, zinc, titanium, and alloys thereof.

One useful substrate is an aluminum-containing support that can be treated using techniques known in the art, including roughening of some type by physical (mechanical) graining, electrochemical graining, or chemical graining, usually followed by acid anodizing. The aluminum-containing support can be roughened by physical or electrochemical graining and then anodized using phosphoric or sulfuric acid (or a mixture of both phosphoric and sulfuric acids) and conventional procedures. A useful hydrophilic lithographic substrate is an electrochemically grained and sulfuric acid-anodized aluminum-containing substrate that provides a hydrophilic surface for lithographic printing.

Sulfuric acid anodization of the aluminum support generally provides an oxide weight (coverage) on the surface of at least 1.5 g/m$^2$ and up to and including 5 g/m$^2$, and can provide longer press life. Phosphoric acid anodization generally provides an oxide weight on the surface of at least 1 g/m$^2$ and up to and including 5 g/m$^2$.

The aluminum-containing substrate can also be post-treated with, for example, a silicate, dextrin, calcium zirconium fluoride, hexafluorosilicic acid, poly(vinyl phosphonic acid) (PVPA), vinyl phosphonic acid copolymer, poly[(meth)acrylic acid], or an acrylic acid copolymer to increase hydrophilicity. Still further, the aluminum-containing substrate can be treated with a phosphate solution that can further contain an inorganic fluoride (PF). It is particularly useful to post-treat the sulfuric acid-anodized aluminum-containing substrate with either poly(acrylic acid) or poly(vinyl phosphonic acid).

The thickness of the substrate can be varied but should be sufficient to sustain the wear from printing and thin enough to wrap around a printing form. Useful embodiments include a treated aluminum foil having a thickness of at least 100 μm and up to and including 700 μm.

The precursors can be formed by suitable application of a radiation-sensitive composition as described below to a suitable substrate (described above) to form an imageable layer. There is generally only a single imageable layer comprising the radiation-sensitive composition and it can be the outermost layer in the negative-working lithographic printing plate precursor, particularly if the precursor is on-press developable. However, such a protective topcoat can be present over the imageable layer in precursors designed for off-press development.

Negative-working lithographic printing plate precursors are described for example, in EP Patent Publications 770,494A1 (Vermeersch et al.), 924,570A1 (Fujimaki et al.), 1,063,103A1 (Uesugi), EP 1,182,033A1 (Fujimako et al.), EP 1,342,568A1 (Vermeersch et al.), EP 1,449,650A1 (Goto), and EP 1,614,539A1 (Vermeersch et al.), U.S. Pat. Nos. 4,511,645 (Koike et al.), 6,027,857 (Teng), 6,309,792 (Hauck et al.), 6,569,603 (Furukawa et al.), 6,899,994 (Huang et al.), 7,045,271 (Tao et al.), 7,049,046 (Tao et al.), 7,261,998 (Hayashi et al.), 7,279,255 (Tao et al.), 7,285,372 (Baumann et al.), 7,291,438 (Sakurai et al.), 7,326,521 (Tao et al.), 7,332,253 (Tao et al.), 7,442,486 (Baumann et al.), 7,452,638 (Yu et al.), 7,524,614 (Tao et al.), 7,560,221 (Timpe et al.), 7,574,959 (Baumann et al.), 7,615,323 (Shrehmel et al.), and 7,672,241 (Munnelly et al.), and U.S. Patent Application Publications 2003/0064318 (Huang et al.), 2004/0265736 (Aoshima et al.), 2005/0266349 (Van Damme et al.), and 2006/0019200 (Vermeersch et al.), all of which are incorporated herein by reference. Other negative-working compositions and elements are described for example in U.S. Pat. Nos. 6,232,038 (Takasaki), 6,627,380 (Saito et al.), 6,514,657 (Sakurai et al.), 6,808,857 (Miyamoto et al.), and U.S. Patent Publication 2009/0092923 (Hayashi), all of which are incorporated herein by reference.

The radiation-sensitive compositions and imageable layers used in such precursors can generally include one or more polymeric binders that facilitate the developability of the imaged precursors. Such polymeric binders include but are not limited to, those that are not generally crosslinkable and are usually present at least partially as discrete particles (non-agglomerated). Such polymers can be present as discrete particles having an average particle size of at least 10 nm and up to and including 500 nm, and typically at least 100 nm and up to and including 450 nm, and that are generally distributed uniformly within that layer. The particulate polymeric binders exist at room temperature as discrete particles, for example in an aqueous dispersion. Such polymeric binders generally have a molecular weight ($M_n$) of at least 5,000 and typically at least 20,000 and up to and including 100,000, or at least 30,000 and up to and including 80,000, as determined by Gel Permeation Chromatography.

Useful particulate polymeric binders generally include polymeric emulsions or dispersions of polymers having hydrophobic backbones to which are directly or indirectly linked pendant poly(alkylene oxide) side chains (for example at least 10 alkylene glycol units), cyano side chains, or both types of side chains, that are described for example in U.S. Pat. Nos. 6,582,882 (Pappas et al.), 6,899,994 (Huang et al.), 7,005,234 (Hoshi et al.), and 7,368,215 (Munnelly et al.) and US Patent Application Publication 2005/0003285 (Hayashi et al.), all of which are incorporated herein by reference. More specifically, such polymeric binders include but are not limited to, graft copolymers having both hydrophobic and hydrophilic segments, block and graft copolymers having polyethylene oxide (PEO) segments, polymers having both pendant poly(alkylene oxide) segments and cyano groups, in recurring units arranged in random fashion to form the polymer backbone, and various hydrophilic polymeric binders that can have various hydrophilic groups such as hydroxyl, carboxy, hydroxyethyl, hydroxypropyl, amino, aminoethyl, aminopropyl, carboxymethyl, sulfono, or other groups readily apparent to a worker skilled in the art.

Alternatively, the particulate polymeric binders can also have a backbone comprising multiple (at least two) urethane moieties. Such polymeric binders generally have a molecular weight ($M_n$) of at least 2,000 and typically at least 100,000 and up to and including 500,000, or at least 100,000 and up to and including 300,000, as determined by dynamic light scattering.

Additional useful polymeric binders are particulate poly (urethane-acrylic) hybrids that are distributed (usually uniformly) throughout the imageable layer. Each of these hybrids has a molecular weight of at least 50,000 and up to and including 500,000 and the particles have an average particle size of at least 10 nm and up to and including 10,000 nm (typically at least 30 nm and up to and including 500 nm). These hybrids can be either "aromatic" or "aliphatic" in nature depending upon the specific reactants used in their manufacture. Blends of particles of two or more poly(urethane-acrylic) hybrids can also be used. Some poly(urethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly(urethane-acrylic) hybrid particles. These dispersions generally include at least 30% solids of the poly(urethane-acrylic) hybrid particles in a suitable aqueous medium that can also include commercial surfactants, anti-foaming agents, dispersing agents, anti-corrosive agents, and optionally pigments and water-miscible organic solvents.

The polymeric binders are generally present in the imageable layer an amount of at least 5 weight % and up to and including 70 weight %.

Other useful polymeric binders can be homogenous, that is, non-particulate or dissolved in the coating solvent, or they can exist as discrete particles. Such polymeric binders include but are not limited to, (meth)acrylic acid and acid ester resins [such as (meth)acrylates], polyvinyl acetals, phenolic resins, polymers derived from styrene, N-substituted cyclic imides or maleic anhydrides, such as those described in EP 1,182,033A1 (Fujimaki et al.) and U.S. Pat. Nos. 6,309,792 (Hauck et al.), 6,352,812 (Shimazu et al.), 6,569,603 (Furukawa et al.), and 6,893,797 (Munnelly et al.), all of which are incorporated herein by reference. Also useful are the vinyl carbazole polymers described in U.S. Pat. No. 7,175,949 (Tao et al.), and the polymers having pendant vinyl groups as described in U.S. Pat. No. 7,279,255 (Tao et al.), both patents being incorporated herein by reference. Useful are random copolymers derived from polyethylene glycol methacrylate/acrylonitrile/styrene monomers in random fashion and in particulate form, dissolved random copolymers derived from carboxyphenyl methacrylamide/acrylonitrile/-methacrylamide/N-phenyl maleimide, random copolymers derived from polyethylene glycol methacrylate/acrylonitrile/vinyl carbazole/styrene/-methacrylic acid, random copolymers derived from N-phenyl maleimide/methacrylamide/methacrylic acid, random copolymers derived from urethane-acrylic intermediate A (the reaction product of p-toluene sulfonyl isocyanate and hydroxyl ethyl methacrylate)/acrylonitrile/N-phenyl maleimide, and random copolymers derived from N-methoxymethyl methacrylamide/methacrylic acid/acrylonitrile/n-phenylmaleimide. By "random" copolymers, we mean the conventional use of the term, that is, the structural units in the polymer backbone that are derived from the monomers are arranged in random order as opposed to being block copolymers, although two or more of the same structural units can be in a chain incidentally.

Thus, the polymeric binders can be selected from any alkaline solution soluble (or dispersible) polymer having an acid value of at least 20 and up to and including 400 (typically at least 30 and up to and including 200). The following described polymeric binders are particularly useful in the manner but this is not an exhaustive list:

I. Polymers formed by polymerization of a combination or mixture of (a) (meth)acrylonitrile, (b) poly(alkylene oxide) esters of (meth)acrylic acid, and optionally (c) (meth)acrylic acid, (meth)acrylate esters, styrene and its derivatives, and (meth)acrylamide as described for example in U.S. Pat. No. 7,326,521 (Tao et al.) that is incorporated herein by reference. Some particularly useful polymeric binders in this class are derived from one or more (meth)acrylic acids, (meth)acrylate esters, styrene and its derivatives, vinyl carbazoles, and poly(alkylene oxide) (meth)acrylates.

II. Polymers having pendant allyl ester groups as described in U.S. Pat. No. 7,332,253 (Tao et al.) that is incorporated herein by reference. Such polymers can also include pendant cyano groups or have recurring units derived from a variety of other monomers as described in Col. 8, line 31 to Col. 10, line 3 of the noted patent.

III. Polymers having all carbon backbones wherein at least 40 mol % and up to and including 100 mol % (and typically at least 40 mol % and up to and including 50 mol %) of the carbon atoms forming the all carbon backbones are tertiary carbon atoms, and the remaining carbon atoms in the all carbon backbone being non-tertiary carbon atoms. Such polymers are defined in more detail in U.S. Patent Application Publication 2008-0280229 (Tao et al.) that is incorporated herein by reference. Representative recurring units comprising tertiary carbon atoms can be derived from one or more ethylenically unsaturated polymerizable monomers selected from vinyl carbazole, styrene and derivatives thereof (other than divinylbenzene and similar monomers that provide pendant carbon-carbon polymerizable groups), acrylic acid, acrylonitrile, acrylamides, acrylates, and methyl vinyl ketone. Similarly, representative recurring units with secondary or quaternary carbon atoms can be derived from one or more ethylenically unsaturated polymerizable monomers selected from methacrylic acid, methacrylates, methacrylamides, and α-methylstyrene.

IV. Polymeric binders that have one or more ethylenically unsaturated pendant groups (reactive vinyl groups) attached to the polymer backbone. Such reactive groups are capable of undergoing polymerizable or crosslinking in the presence of free radicals. The pendant groups can be directly attached to the polymer backbone with a carbon-carbon direct bond, or through a linking group ("X") that is not particularly limited. The reactive vinyl groups can be substituted with at least one halogen atom, carboxy group, nitro group, cyano group, amide group, or alkyl, aryl, alkoxy, or aryloxy group, and particularly one or more alkyl groups. In some embodiments, the reactive vinyl group is attached to the polymer backbone through a phenylene group as described, for example, in U.S. Pat. No. 6,569,603 (Furukawa et al.) that is incorporated herein by reference. Other useful polymeric binders have vinyl groups in pendant groups that are described, for example in EP 1,182,033A1 (Fujimaki et al.) and U.S. Pat. Nos. 4,874,686 (Urabe et al.), 7,729,255 (Tao et al.), 6,916,595 (Fujimaki et al.), and 7,041,416 (Wakata et al.) that are incorporated by reference, especially with respect to the general formulae (1) through (3) noted in EP 1,182,033A1.

V. Polymeric binders can have pendant 1H-tetrazole groups as described in U.S. Patent Application Publication 2009-0142695 (Baumann et al.) that is incorporated herein by reference.

VI. Still other useful polymeric binders can be homogenous, that is, dissolved in the coating solvent, or can exist as discrete particles and include but are not limited to, (meth)acrylic acid and acid ester resins [such as (meth)acrylates], polyvinyl acetals, phenolic resins, polymers derived from styrene, N-substituted cyclic imides or maleic anhydrides, such as those described in EP 1,182,033 (noted above) and U.S. Pat. Nos. 6,309,792 (Hauck et al.), 6,352,812 (Shimazu et al.), 6,569,603 (noted above), and 6,893,797 (Munnelly et al.). Also useful are the vinyl carbazole polymers described in U.S. Pat. No. 7,175,949 (Tao et al.). Other useful polymeric binders are particulate poly(urethane-acrylic) hybrids that are distributed (usually uniformly) throughout the imageable layer.

The radiation-sensitive composition (and imageable layer) includes one or more free radically polymerizable components, each of which contains one or more free radically polymerizable groups that can be polymerized using free radical initiation. For example, such free radically polymerizable components can contain one or more free radical polymerizable monomers or oligomers having one or more addition polymerizable ethylenically unsaturated groups, crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used. Oligomers or prepolymers, such as urethane acrylates and methacrylates, epoxide acrylates and methacrylates, polyester acrylates and methacrylates, polyether acrylates and methacrylates, and unsaturated polyester resins can be used. In some embodiments, the free radically polymerizable component comprises carboxyl groups.

Free radically polymerizable compounds include those derived from urea urethane (meth)acrylates or urethane (meth)acrylates having multiple polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritoltriacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), and Sartomer 415 [ethoxylated (20)trimethylolpropane triacrylate] that are available from Sartomer Company, Inc.

Numerous other free radically polymerizable components are known to those skilled in the art and are described in considerable literature including *Photoreactive Polymers: The Science and Technology of Resists*, A Reiser, Wiley, New York, 1989, pp. 102-177, by B. M. Monroe in *Radiation*

*Curing: Science and Technology*, S. P. Pappas, Ed., Plenum, N.Y., 1992, pp. 399-440, and in "Polymer Imaging" by A. B. Cohen and P. Walker, in *Imaging Processes and Material*, J. M. Sturge et al. (Eds.), Van Nostrand Reinhold, N.Y., 1989, pp. 226-262. For example, useful free radically polymerizable components are also described in EP 1,182,033A1 (Fujimaki et al.), beginning with paragraph [0170], and in U.S. Pat. Nos. 6,309,792 (Hauck et al.), 6,569,603 (Furukawa), and 6,893,797 (Munnelly et al.). Other useful free radically polymerizable components include those described in U.S. Patent Application Publication 2009/0142695 (Baumann et al.), which radically polymerizable components include 1H-tetrazole groups.

In addition to, or in place of the free radically polymerizable components described above, the radiation-sensitive composition can include polymeric materials that include side chains attached to the backbone, which side chains include one or more free radically polymerizable groups (such as ethylenically unsaturated groups) that can be polymerized (crosslinked) in response to free radicals produced by the initiator composition (described below). There can be at least two of these side chains per molecule. The free radically polymerizable groups (or ethylenically unsaturated groups) can be part of aliphatic or aromatic acrylate side chains attached to the polymeric backbone. Generally, there are at least 2 and up to and including 20 such groups per molecule.

Such free radically polymerizable polymers can also comprise hydrophilic groups including but not limited to, carboxy, sulfo, or phospho groups, either attached directly to the backbone or attached as part of side chains other than the free radically polymerizable side chains.

This radiation-sensitive composition also includes an initiator composition that includes one or more initiators that are capable of generating free radicals sufficient to initiate polymerization of all the various free radically polymerizable components upon exposure of the composition to imaging infrared radiation. The initiator composition is generally responsive, for example, to electromagnetic radiation in the infrared spectral regions, corresponding to the broad spectral range of at least 700 nm and up to and including 1400 nm, and typically radiation of at least 700 nm and up to and including 1250 nm. Alternatively, the initiator composition may be responsive to exposing radiation in the ultraviolet or visible region of at least 250 nm and up to and including 650 nm and typically at least 300 nm and up to and including 650 nm.

More typically, the initiator composition includes one or more an electron acceptors and one or more co-initiators that are capable of donating electrons, hydrogen atoms, or a hydrocarbon radical.

In general, suitable initiator compositions for radiation-sensitive compositions comprise initiators that include but are not limited to, aromatic sulfonylhalides, trihalogenomethylsulfones, imides (such as N-benzoyloxyphthalimide), diazosulfonates, 9,10-dihydroanthracene derivatives, N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof and other "co-initiators" described in U.S. Pat. No. 5,629,354 of West et al.), oxime ethers and oxime esters (such as those derived from benzoin), α-hydroxy or α-amino-acetophenones, trihalogenomethyl-arylsulfones, benzoin ethers and esters, peroxides (such as benzoyl peroxide), hydroperoxides (such as cumyl hydroperoxide), azo compounds (such as azo bis-isobutyronitrile), 2,4,5-triarylimidazolyl dimers (also known as hexaarylbiimidazoles, or "HABI's") as described for example in U.S. Pat. No. 4,565,769 (Dueber et al.), trihalomethyl substituted triazines, boron-containing compounds (such as tetraarylborates and alkyltriarylborates) and organoborate salts such as those described in U.S. Pat. No. 6,562,543 (Ogata et al.), and onium salts (such as ammonium salts, diaryliodonium salts, triarylsulfonium salts, aryldiazonium salts, and N-alkoxypyridinium salts).

Hexaarylbiimidazoles, onium compounds, and thiol compounds as well as mixtures of two or more thereof are desired co-initiators or free radical generators, and especially hexaarylbiimidazoles and mixtures thereof with thiol compounds are useful. Suitable hexaarylbiimidazoles are also described in U.S. Pat. Nos. 4,565,769 (Dueber et al.) and 3,445,232 (Shirey) and can be prepared according to known methods, such as the oxidative dimerization of triarylimidazoles.

Useful initiator compositions for IR radiation-sensitive compositions include onium compounds including ammonium, sulfonium, iodonium, and phosphonium compounds. Useful iodonium cations are well known in the art including but not limited to, U.S. Patent Application Publication 2002/0068241 (Oohashi et al.), WO 2004/101280 (Munnelly et al.), and U.S. Pat. Nos. 5,086,086 (Brown-Wensley et al.), 5,965,319 (Kobayashi), and 6,051,366 (Baumann et al.), all incorporated herein by reference. For example, a useful iodonium cation includes a positively charged iodonium, (4-methylphenyl)[4-(2-methylpropyl)phenyl]-moiety and a suitable negatively charged counterion. Thus, the iodonium cations can be supplied as part of one or more iodonium salts, and the iodonium cations can be supplied as iodonium borates also containing suitable boron-containing anions. For example, the iodonium cations and the boron-containing anions can be supplied as part of substituted or unsubstituted diaryliodonium salts that are combinations of Structures (I) and (II) described in Cols. 6-8 of U.S. Pat. No. 7,524,614 (Tao et al.) that is incorporated herein by reference.

Useful IR radiation-sensitive initiator compositions can comprise one or more diaryliodonium borate compounds. Representative iodonium borate compounds useful in this invention include but are not limited to, 4-octyloxyphenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexyl-phenyliodonium n-butyltriphenylborate, 4-cyclohexylphenyl-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]borate, 4-methoxyphenyl-4'-cyclohexyl-phenyliodonium tetrakis(penta-fluorophenyl)borate, 4-methylphenyl-4'-dodecylphenyliodonium tetrakis(4-fluorophenyl)borate, bis(dodecylphenyl)-iodonium tetrakis(pentafluorophenyl)-borate, and bis(4-t-butylphenyl)iodonium tetrakis(1-imidazolyl)borate. Useful compounds include bis(4-t-butylphenyl)-iodonium tetraphenylborate, 4-methylphenyl-4'-hexylphenyliodonium tetraphenylborate, 2-methyl-4-t-butylphenyl-4'-methylphenyliodonium tetraphenylborate, and 4-methylphenyl-4'-cyclohexylphenyliodonium tetraphenylborate. Mixtures of two or more of these compounds can also be used in the initiator composition.

The imageable layers comprise a radiation-sensitive imaging composition that includes one or more infrared radiation absorbers or one or more UV sensitizers. The total amount of one or more infrared radiation absorbers or sensitizers is at least 1 weight % and up to and including 30 weight %, or typically at least 5 weight % and up to and including 20 weight % of the imageable layer.

In some embodiments, the radiation-sensitive composition contains a UV sensitizer where the free-radical generating compound is UV radiation sensitive (that is at least 150 nm and up to and including 475 nm), thereby facilitating photopolymerization. In some other embodiments, the radiation sensitive compositions are sensitized to "violet" radiation in the range of at least 375 nm and up to and including 475 nm. Useful sensitizers for such compositions include certain pyrilium and thiopyrilium dyes and 3-ketocoumarins. Some other useful sensitizers for such spectral sensitivity are described for example, in U.S. Pat. No. 6,908,726 (Korionoff et al.), WO 2004/074929 (Baumann et al.) that describes useful bisoxazole derivatives and analogues, and U.S. Patent Application Publications 2006/0063101 and 2006/0234155 (both Baumann et al.).

Still other useful sensitizers are the oligomeric or polymeric compounds having Structure (I) units defined in WO 2006/053689 (Strehmel et al.) that have a suitable aromatic or heteroaromatic unit that provides a conjugated $\pi$-system between two heteroatoms.

Additional useful "violet"-visible radiation sensitizers are the compounds described in WO 2004/074929 (Baumann et al.). These compounds comprise the same or different aromatic heterocyclic groups connected with a spacer moiety that comprises at least one carbon-carbon double bond that is conjugated to the aromatic heterocyclic groups, and are represented in more detail by Formula (I) of the noted publication.

Other useful sensitizers for the violet region of sensitization are the 2,4,5-triaryloxazole derivatives as described in WO 2004/074930 (Baumann et al.). These compounds can be used alone or with a co-initiator as described above. Useful 2,4,5-triaryloxazole derivatives can be represented by the Structure G-$(Ar_1)_3$ wherein $Ar_1$ is the same or different, substituted or unsubstituted carbocyclic aryl group having 6 to 12 carbon atoms in the ring, and G is a furan or oxazole ring, or the Structure G-$(Ar_1)_2$ wherein G is an oxadiazole ring. The $Ar_1$ groups can be substituted with one or more halo, substituted or unsubstituted alkyl, substituted or unsubstituted cycloalkyl, substituted or unsubstituted aryl, amino (primary, secondary, or tertiary), or substituted or unsubstituted alkoxy or aryloxy groups. Thus, the aryl groups can be substituted with one or more $R'_1$ through $R'_3$ groups, respectively, that are independently hydrogen or a substituted or unsubstituted alkyl group having from 1 to 20 carbon atoms (such as methyl, ethyl, iso-propyl, n-hexyl, benzyl, and methoxymethyl groups) substituted or unsubstituted carbocyclic aryl group having 6 to 10 carbon atoms in the ring (such as phenyl, naphthyl, 4-methoxyphenyl, and 3-methylphenyl groups), substituted or unsubstituted cycloalkyl group having 5 to 10 carbon atoms in the ring, a —N($R'_4$)($R'_5$) group, or a —O$R'_6$ group wherein $R'_4$ through $R'_6$ independently represent substituted or unsubstituted alkyl or aryl groups as defined above. At least one of $R'_1$ through $R'_3$ is an —N($R'_4$)($R'_5$) group wherein $R'_4$ and $R'_5$ are the same or different alkyl groups. Useful substituents for each $Ar_1$ group include the same or different primary, secondary, and tertiary amines.

Still another class of useful violet radiation sensitizers includes compounds represented by the Structure $Ar_1$-G-$Ar_2$ wherein $Ar_1$ and $Ar_2$ are the same or different substituted or unsubstituted aryl groups having 6 to 12 carbon atoms in the ring, or $Ar_2$ can be an arylene-G-$Ar_1$ or arylene-G-$Ar_2$ group, and G is a furan, oxazole, or oxadiazole ring. $Ar_1$ is the same as defined above, and $Ar_2$ can be the same or different aryl group as $Ar_1$. "Arylene" can be any of the aryl groups defined for $Ar_1$ but with a hydrogen atom removed to render them divalent in nature.

Some useful infrared radiation absorbers are sensitive to both infrared radiation (typically of at least 700 nm and up to and including 1400 nm) and visible radiation (typically of at least 450 nm and up to and including 700 nm). These compounds can have a tetraaryl pentadiene chromophore. Such chromophore generally includes a pentadiene linking group having 5 carbon atoms in the chain, to which are attached two substituted or unsubstituted aryl groups at each end of the linking group. These aryl groups can be substituted with the same or different tertiary amine groups. Other details of such compounds are provided in U.S. Pat. No. 7,429,445 (Munnelly et al.) that is incorporated herein by reference.

Other useful IR absorbers include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. Nos. 5,208,135 (Patel et al.), 6,153,356 (Urano et al.), 6,264,920 (Achilefu et al.), 6,309,792 (Hauck et al.), 6,569,603 (noted above), 6,787, 281 (Tao et al.), 7,135,271 (Kawaushi et al.), and EP 1,182, 033A2 (noted above). Infrared radiation absorbing N-alkyl-sulfate cyanine dyes are described for example in U.S. Pat. No. 7,018,775 (Tao). A general description of one class of suitable cyanine dyes is shown by the formula in paragraph [0026] of WO 2004/101280 (Munnelly et al.).

In addition to low molecular weight IR-absorbing dyes, IR dye chromophores bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. Nos. 6,309,792 (noted above), 6,264,920 (Achilefu et al.), 6,153,356 (noted above), and 5,496,903 (Watanabe et al.). Suitable dyes can be formed using conventional methods and starting materials or obtained from various commercial sources including American Dye Source (Baie D'Urfe, Quebec, Canada) and FEW Chemicals (Germany). Other useful dyes for near infrared diode laser beams are described in U.S. Pat. No. 4,973,572 (DeBoer).

Useful IR-radiation sensitive compositions are described, for example, in U.S. Pat. No. 7,452,638 (Yu et al.), and U.S. Patent Application Publications 2008/0254387 (Yu et al.), 2008/0311520 (Yu et al.), 2009/0263746 (Ray et al.), and 2010/0021844 (Yu et al.).

The imageable layer can also include a poly(alkylene glycol) or an ether or ester thereof that has a molecular weight of at least 200 and up to and including 4000. The imageable layer can further include a poly(vinyl alcohol), a poly(vinyl pyrrolidone), poly(vinyl imidazole), or polyester in an amount of up to and including 20 weight % based on the total dry weight of the imageable layer.

Additional additives to the imageable layer include color developers or acidic compounds. Color developers include monomeric phenolic compounds, organic acids or metal salts thereof, oxybenzoic acid esters, acid clays, and other compounds described for example in U.S. Patent Application Publication 2005/0170282 (Inno et al.). The imageable layer can also include a variety of optional compounds including but not limited to, dispersing agents, humectants, biocides, plasticizers, surfactants for coatability or other properties, viscosity builders, pH adjusters, drying agents, defoamers, preservatives, antioxidants, development aids, rheology modifiers or combinations thereof, or any other addenda commonly used in the lithographic art, in conventional amounts. The imageable layer also optionally includes a phosphate (meth)acrylate having a molecular weight generally greater than 250 as described in U.S. Pat. No. 7,429,445 (Munnelly et al.) that is incorporated herein by reference.

The radiation-sensitive composition can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder). Typically, the radiation-sensitive composition is applied and dried to form an imageable layer.

If the imageable layer is not the outermost layer, an outermost layer can be a water-soluble or water-dispersible protective overcoat (also sometimes known as an "oxygen impermeable topcoat" or "oxygen bather layer") disposed over the imageable layer. Such overcoats can comprise one or more water-soluble poly(vinyl alcohol)s having a saponification degree of at least 90% and generally have a dry coating weight of at least 0.1 g/m$^2$ and up to and including 2 g/m$^2$ in which the water-soluble poly(vinyl alcohol)s comprise at least 60% and up to and including 99% of the dry overcoat layer weight.

The overcoat can further comprise a second water-soluble polymer that is not a poly(vinyl alcohol) in an amount of at least 2 weight % and up to and including 38 weight %, and such second water-soluble polymer can be a poly(vinyl pyrrolidone), poly(ethyleneimine), poly(vinyl imidazole), poly (vinyl caprolactone), or a random copolymer derived from two or more of vinyl pyrrolidone, ethyleneimine, vinyl caprolactone, and vinyl imidazole, and vinyl acetamide.

Alternatively, the overcoat can be formed predominantly using one or more of polymeric binders such as poly(vinyl pyrrolidone), poly(ethyleneimine), poly(vinyl imidazole), and random copolymers from two or more of vinyl pyrrolidone, ethyleneimine and vinyl imidazole, and mixtures of such polymers. The formulations can also include cationic, anionic, and non-ionic wetting agents or surfactants, flow improvers or thickeners, antifoamants, colorants, particles such as aluminum oxide and silicon dioxide, and biocides. Details about such addenda are provided in WO 99/06890 (Pappas et al.) that is incorporated by reference.

Illustrative of precursor manufacturing methods includes mixing the various components needed for a specific imageable layer in a suitable organic solvent or mixtures thereof [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting formulation to a substrate, and removing the solvent(s) by evaporation under suitable drying conditions. After proper drying, the coating weight of the imageable layer is generally at least 0.1 g/m$^2$ and up to and including 5 g/m$^2$ or at least 0.5 g/m$^2$ and up to and including 3.5 g/m$^2$.

Layers can also be present under the imageable layer to enhance developability or to act as a thermal insulating layer.

Once the various layers have been applied and dried on the substrate, the negative-working lithographic printing plate precursors can be enclosed in water-impermeable material that substantially inhibits the transfer of moisture to and from the precursor and "heat conditioned" as described in U.S. Pat. No. 7,175,969 (noted above) that is incorporated herein by reference.

The lithographic printing plate precursors can be stored and transported as stacks of precursors within suitable packaging and containers known in the art.

The present invention provides at least the following embodiments and combinations thereof, but other combinations of features are considered to be within the present invention as a skilled artisan would appreciate from the teaching of this disclosure:

1. A lithographic printing plate coloring fluid comprising a water-insoluble colorant dissolved in a water-insoluble fatty alcohol having at least 4 carbon atoms.

2. The lithographic printing plate coloring fluid of embodiment 1 further comprising an anionic surfactant, nonionic surfactant, cationic surfactant, or amphoteric surfactant, or multiple types of surfactants.

3. The lithographic printing plate coloring fluid of embodiment 1 or 2 further comprising a film-forming water-soluble or hydrophilic polymer.

4. The lithographic printing plate coloring fluid of any of embodiments 1 to 3 wherein the water-insoluble colorant is an oleophilic diazo, phenazine, triphenazine-ozazine, or indulin dye, or mixtures of two or more of such oleophilic dyes.

5. The lithographic printing plate coloring fluid of any of embodiments 1 to 4 comprising the water-insoluble colorant in an amount of at least 0.1 and up to and including 3 weight %.

6. The lithographic printing plate coloring fluid of any of embodiments 1 to 5 that is an oil-in-water emulsion.

7. The lithographic printing plate coloring fluid of any of embodiments 1 to 6 further comprising a photoinitiator that is capable of providing free radicals in response to UV radiation.

8. The lithographic printing plate coloring fluid of any of embodiments 1 to 7 comprising an UV photoinitiator that is capable of providing free radicals in response to UV radiation, in an amount of at least 0.001 weight % and up to and including 1 weight %.

9. The lithographic printing plate coloring fluid of any of embodiments 1 to 8 wherein the water-insoluble fatty alcohol in the coloring fluid comprises at least 4 carbon atoms.

10. The lithographic printing plate coloring fluid of any of embodiments 1 to 9 wherein the water-insoluble fatty alcohol is present in the coloring fluid in an amount of at least 10 weight % and up to and including 80 weight %.

11. The lithographic printing plate coloring fluid of any of embodiments 1 to 10 wherein the coloring fluid further comprises a water-miscible polar organic solvent in an amount of at least 5 weight %.

12. The coloring fluid of any of embodiments 1 to 11 that has a pH of at least 5 and up to and including 14.

13. A method of preparing a lithographic printing plate comprising, in order:

imagewise exposing a negative-working lithographic printing plate precursor comprising a substrate and a radiation-sensitive imageable layer disposed thereon comprising a free radically polymerizable compound, a radiation absorber, a free radical initiator composition, and a polymeric binder, to provide an exposed precursor comprising exposed and non-exposed regions in the imageable layer, wherein the exposed regions have an optical density of $OD_1$, and applying a coloring fluid to the exposed precursor such that the optical density in the exposed regions is $OD_2$ that is greater than $OD_1$, wherein the coloring fluid is in defined in any of embodiments 1 to 12.

14. The method of embodiment 13 wherein applying the coloring fluid also removes the non-exposed regions in the imageable layer.

15. The method of embodiment 13 or 14 further comprising: removing the non-exposed regions in the imageable layer using a processing solution, to provide a lithographic printing plate, and subsequently applying the coloring fluid to the lithographic printing plate.

16. The method of embodiment 15 wherein the processing solution comprises a photoinitiator that is capable of providing free radicals in response to UV radiation.

17. The method of embodiment 15 or 16 further comprising:

after applying the coloring fluid to the lithographic printing plate, uniformly exposing the lithographic printing plate to UV radiation to further cause color change in the exposed regions of the imageable layer while leaving the non-exposed regions unchanged.

18. The method of any of embodiments 13 to 17 further comprising heating the lithographic printing plate before, during, or after the uniform exposing to UV radiation.

19. The method of embodiment 13 or 14 further comprising:

after applying the coloring fluid to the exposed precursor, removing the non-exposed regions of the imageable layer using a processing solution to provide a lithographic printing plate.

20. The method of embodiment 19 wherein the processing solution both develops and protects the outer surface of the lithographic printing plate.

21. The method of any of embodiments 13 to 20 wherein the coloring fluid both develops and protects the outer surface of the exposed precursor.

22. The method of any of embodiments 13 to 21 wherein the difference between $OD_1$ and $OD_2$ is at least 0.1.

23. The method of any of embodiments 13 to 22 wherein the difference between $OD_1$ and $OD_2$ is at least 0.25.

24. The method of any of embodiments 13 to 23 wherein the imagewise exposing is carried out using energy of at least 150 $mJ/cm^2$ of infrared radiation.

25. The method of any of embodiments 13 to 24 wherein the negative-working lithographic printing plate precursor comprises an infrared radiation absorber to render it infrared radiation-sensitive and the imagewise exposing is carried out using infrared radiation at a wavelength of at least 700 nm and up to and including 1400 nm.

26. The method of any of embodiments 13 to 25 wherein the imageable layer is the outermost layer of the negative-working lithographic printing plate precursor.

27. The method of any of embodiments 13 to 26 further comprising mechanically or manually brushing or rubbing the exposed precursor while applying the coloring fluid.

28. The method of any of embodiments 13 to 27 wherein the negative-working lithographic plate precursor is on-press developable.

The following Examples are provided to illustrate the practice of this invention and are not meant to be limiting in any manner.

Comparative Example 1

An electrochemically-grained and phosphoric acid anodized aluminum substrate that had been post treated with poly(acrylic acid) was coated with the imageable layer formulation described in Example 18 of U.S. Pat. No. 7,261,998 (Hayashi et al.) that is incorporated herein by reference. The resulting printing plate precursor was imaged a solid at 320 $mJ/cm^2$ on a Kodak Trendsetter 3244x plate setter.

The imaged printing plate precursor was manually developed with light pressure hand scrubbing in Mixture A shown below. This removed all background imageable layer coating, leaving a lightly colored image barely discernable with the eye.

| Mixture A | Parts by weight |
|---|---|
| Kodak Plate Finisher 850 | 30.0 |
| Water | 68 |
| Poly(acrylic acid), sodium salt | 0.3 |
| Sodium ethyl hexyl sulfate | 0.4 |
| Citric acid | 0.17 |
| 2-Phenoxyethanol | 2.0 |

Kodak Plate Finisher 850 is composed of predominantly water and dextrin (5-10 weight %).

Invention Example 1

Another sample of the lithographic printing plate precursor described in Comparative Example 1 was imaged as described above.

2-Phenoxy ethanol (60 g) was warmed and 1-dodecanol (150 g) was dissolved in it. Sudan Black B (4 g) and Irgacure® 365 (0.1 g) were then stirred in until they were completely dissolved to form Mixture B. The imaged precursor was developed using Mixture A and then rubbed with Mixture B. The resulting lithographic image became much darker and easily visible, but the background remained clean. The printing plate was then exposed to UV light, was mounted onto a printing press, and used to print 50,000 good quality printing impressions.

Invention Example 2

The following Mixtures C and D were prepared:

|  | Parts by weight |
|---|---|
| Mixture C |  |
| Kodak Plate Finisher 850 | 30.0 |
| Water | 68 |
| Poly(acrylic acid), sodium salt | 0.3 |
| Sodium ethyl hexyl sulfate | 0.4 |
| Citric acid | 0.17 |
| 2-Phenoxy ethanol | 2.0 |
| Triton ® 405X | 4 |
| Mixture D |  |
| Mixture B shown above | 100 |
| Water | 100 |

Mixture C was the slowly added to Mixture D while Mixture D was stirred at high speed to provide an emulsion with an internal phase of Mixture C and an aqueous phase of Mixture D. This emulsion was then applied to the imaged precursor to provide a dark readable image with clean background. The lithographic printing plate was then exposed to UV light, placed on an offset machine, and used to print 50,000 good impressions.

The invention has been described in detail with particular reference to certain preferred embodiments thereof, but it will be understood that variations and modifications can be effected within the spirit and scope of the invention.

The invention claimed is:

1. A method of preparing a lithographic printing plate comprising, in order:

imagewise exposing a negative-working lithographic printing plate precursor comprising a substrate and a radiation-sensitive imageable layer disposed thereon comprising a free radically polymerizable compound, a radiation absorber, a free radical initiator composition, and a polymeric binder, to provide an exposed precursor comprising exposed and non-exposed regions in the imageable layer, wherein the exposed regions have an optical density of $OD_1$, and applying a coloring fluid to the exposed precursor such that the optical density in the exposed regions is $OD_2$ that is greater than $OD_1$, wherein the coloring fluid comprises a water-insoluble fatty alcohol and a water-insoluble colorant that is soluble in the water-insoluble fatty alcohol.

2. The method of claim 1 wherein applying the coloring fluid also removes the non-exposed regions in the imageable layer, and the coloring fluid has a pH of at least 5 and up to and including 14.

3. The method of claim 1 further comprising:

removing the non-exposed regions in the imageable layer using a processing solution, to provide a lithographic printing plate, and subsequently applying the coloring fluid to the lithographic printing plate.

4. The method of claim 3 wherein the processing solution comprises a photoinitiator that is capable of providing free radicals in response to UV radiation.

5. The method of claim 4 further comprising:

after applying the coloring fluid to the lithographic printing plate, uniformly exposing the lithographic printing plate to UV radiation to further cause color change in the exposed regions of the imageable layer while leaving the non-exposed regions unchanged.

6. The method of claim 3 wherein the coloring fluid further comprises a photoinitiator that is capable of providing free radicals in response to UV radiation.

7. The method of claim 6 further comprising:

after applying the coloring fluid to the lithographic printing plate, uniformly exposing the lithographic printing plate to UV radiation to further cause color change in the exposed regions of the imageable layer while leaving the non-exposed regions unchanged.

8. The method of claim 6 further comprising heating the lithographic printing plate before, during, or after the uniform exposing to UV radiation.

9. The method of claim 1 further comprising:

after applying the coloring fluid to the exposed precursor, removing the non-exposed regions of the imageable layer using a processing solution to provide a lithographic printing plate.

10. The method of claim 5 wherein the processing solution both develops and protects the outer surface of the lithographic printing plate.

11. The method of claim 1 wherein the coloring fluid both develops and protects the outer surface of the exposed precursor.

12. The method of claim 1 wherein the coloring fluid further comprises an anionic surfactant, nonionic surfactant, cationic surfactant, or amphoteric surfactant, or multiple types of surfactants.

13. The method of claim 1 wherein the coloring fluid further comprises a film-forming water-soluble or hydrophilic polymer.

14. The method of claim 1 wherein the water-insoluble colorant is an oleophilic diazo, phenazine, triphenazine-oxazine, or induline dye, or mixtures of two or more of such oleophilic dyes.

15. The method of claim 1 wherein the water-insoluble colorant is present in the coloring fluid in an amount of at least 0.1 and up to and including 3 weight %.

16. The method of claim 1 wherein the water-insoluble fatty alcohol in the coloring fluid comprises at least 4 carbon atoms.

17. The method of claim 1 wherein the water-insoluble fatty alcohol is present in the coloring fluid in an amount of at least 10 weight % and up to and including 80 weight %.

18. The method of claim 1 wherein the coloring fluid further comprises a water-miscible polar organic solvent in an amount of at least 5 weight %.

19. The method of claim 1 wherein the difference between $OD_1$ and $OD_2$ is at least 0.1.

20. The method of claim 1 wherein the difference between $OD_1$ and $OD_2$ is at least 0.25.

21. The method of claim 1 wherein the imagewise exposing is carried out using energy of at least 150 $mJ/cm^2$ of infrared radiation.

22. The method of claim 1 wherein the negative-working lithographic printing plate precursor comprises an infrared radiation absorber to render it infrared radiation-sensitive and the imagewise exposing is carried out using infrared radiation at a wavelength of at least 700 nm and up to and including 1400 nm.

23. The method of claim 1 wherein the imageable layer is the outermost layer of the negative-working lithographic printing plate precursor.

24. The method of claim 1 further comprising mechanically or manually brushing or rubbing the exposed precursor while applying the coloring fluid.

25. The method of claim 1 wherein the negative-working lithographic plate precursor is on-press developable.

* * * * *